(12) United States Patent
Wood et al.

(10) Patent No.: US 7,152,313 B2
(45) Date of Patent: Dec. 26, 2006

(54) PACKAGE SUBSTRATE FOR INTEGRATED CIRCUIT AND METHOD OF MAKING THE SUBSTRATE

(75) Inventors: Dustin P. Wood, Chandler, AZ (US); Mark E. Thurston, Chandler, AZ (US); Mahadevan Suryakumar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 314 days.

(21) Appl. No.: 10/723,414

(22) Filed: Nov. 26, 2003

(65) Prior Publication Data

US 2005/0111207 A1    May 26, 2005

(51) Int. Cl.
*H05K 3/38* (2006.01)
(52) U.S. Cl. .................... 29/830; 29/846; 156/514; 174/259; 174/261
(58) Field of Classification Search .............. None
See application file for complete search history.

(56) References Cited

U.S. PATENT DOCUMENTS

| | | | | |
|---|---|---|---|---|
| 4,250,616 A | * | 2/1981 | Klimek et al. ............... 29/830 |
| 4,916,260 A | * | 4/1990 | Broaddus et al. ........... 174/268 |
| 5,946,470 A | * | 8/1999 | Neal et al. .................... 703/21 |
| 6,106,923 A | * | 8/2000 | Takahashi et al. .......... 428/131 |
| 6,184,477 B1 | * | 2/2001 | Tanahashi ................... 174/261 |
| 6,191,472 B1 | * | 2/2001 | Mazumder .................. 257/691 |
| 6,392,301 B1 | * | 5/2002 | Waizman et al. ........... 257/774 |
| 6,426,469 B1 | * | 7/2002 | Koga et al. ................. 174/262 |
| 6,496,081 B1 | * | 12/2002 | Govind et al. ............ 333/28 R |

* cited by examiner

*Primary Examiner*—John B. Vigushin
(74) *Attorney, Agent, or Firm*—Buckley, Maschoff & Talwalkar LLC

(57) ABSTRACT

In some embodiments, an article of manufacture includes a metal layer and a first dielectric layer in contact with a first face of the metal layer. The article of manufacture also includes a second dielectric layer in contact with a second face of the metal layer. The second face of the metal layer is opposite to the first face of the metal layer. The metal layer may be a continuous sheet having slots formed therein to allow the first and second dielectric layers to adhere to each other by way of the slots.

8 Claims, 6 Drawing Sheets

PACKAGE SUBSTRATE FOR INTEGRATED CIRCUIT AND METHOD OF MAKING THE SUBSTRATE

BACKGROUND

Integrated circuits (ICs) such as microprocessors are typically mounted on package substrates that help to provide an interface between the integrated circuit die and a circuit board. A typical package substrate may include alternating metal and dielectric layers. Among the metal layers, some may form ground or power planes and others may be used for signal traces. In the case of the ground or power plane layers, it is known to form adhesion holes in the layers so that the two dielectric layers on either side of the ground or power plane may adhere to each other. This may aid in preventing delamination of the substrate structure.

According to some typical practices, signal traces in metal layers that are adjacent to a ground or power plane layer (with a dielectric layer in between, of course) are routed so as not to pass over the locus of the adhesion holes in the adjacent ground or power plane. This is done because signals in traces which pass over or under an adhesion hole or holes may suffer distortion due to crosstalk and/or timing skew. However, as IC technology advances, there is a tendency to increase the density of signal traces in the package substrate, which leads to conflicts with the desire to avoid routing traces over or under adhesion holes. One way of resolving this conflict is to increase the number of signal layers, but this increases the cost of the package substrate.

DETAILED DESCRIPTION

Figure 1:
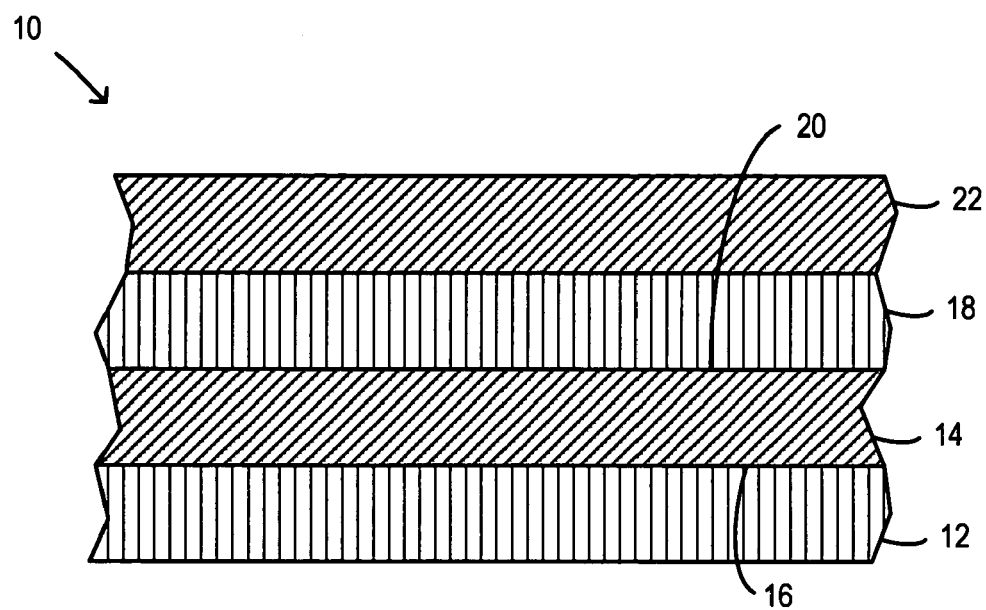
FIG. 1 is a partial schematic side cross-sectional view of a package substrate, according to some embodiments.

FIG. 1 is a partial schematic side cross-sectional view of a package substrate 10, according to some embodiments.

The package substrate 10 includes a first dielectric layer 12 and a first metal layer 14 that has been formed on the first dielectric layer 12. The first dielectric layer 12 is in contact with a lower face 16 of the first metal layer 14. The first metal layer 14 may be a ground plane or a power plane.

The package substrate 10 further includes a second dielectric layer 18 that has been formed on the first metal layer 14. The second dielectric layer 18 is in contact with an upper face 20 of the first metal layer 14.

The package substrate 10 also includes a second metal layer 22 that has been formed on the second dielectric layer 18. The second metal layer 22 may be a signal layer (i.e., may include signal traces for carrying signals to and/or from an IC die, which is not shown in FIG. 1).

The metal layers 14, 22 may be formed of copper, for example. The dielectric layers 12, 18 may be formed of any suitable dielectric material, such as an epoxy based material. In some embodiments, the dielectric layers 12, 18 may be formed of a phenolic resin-based epoxy material. The respective thicknesses of the metal layers 14, 22 and the dielectric layers 12, 18 may be provided in accordance with conventional principles.

Although only two metal layers and two dielectric layers of the package substrate 10 are shown, in some embodiments the package substrate 10 may include considerably more metal and dielectric layers. For example, the total number of metal layers may be in the range of six to twelve, of which approximately half may be signal layers, and the rest may be ground planes or power planes. Although not shown in the drawing, there may be vias between two or more of the metal layers.

Figure 2:
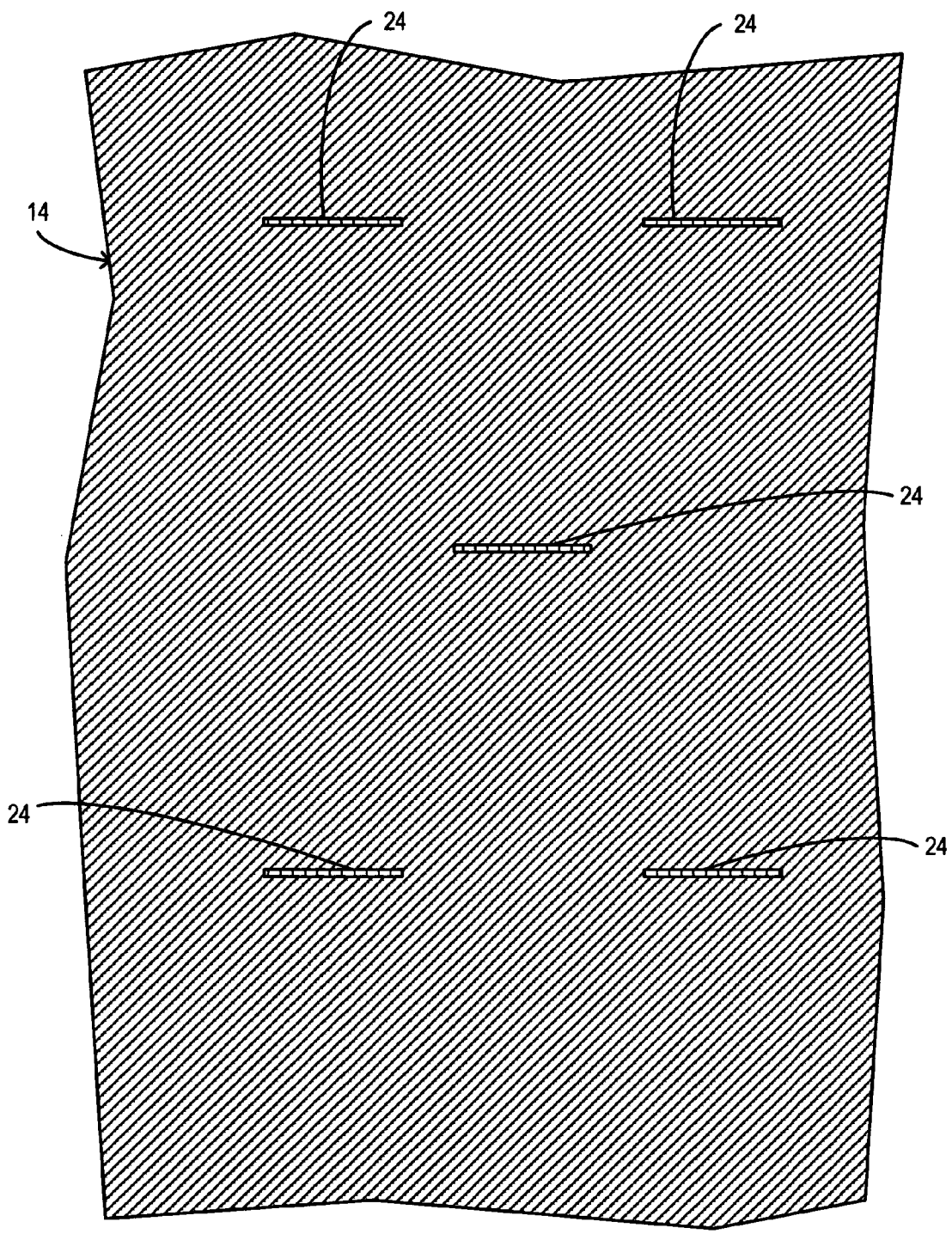
FIG. 2 is a partial schematic plan view of a ground or power plane metal layer of the package substrate of FIG. 1, according to some embodiments.

FIG. 2 is a partial schematic plan view of the metal layer 14, according to some embodiments. As seen from FIG. 2, adhesion slots 24 are formed in the metal layer 14 to allow the first dielectric layer 12 (FIG. 1) and the second dielectric layer 18 (FIG. 1) to adhere to each other by way of the adhesions slots 24 (FIG. 2).

The portion of the metal layer 14 shown in FIG. 2 may be a relatively small part of the metal layer 14, and the five adhesion slots 24 shown in FIG. 2 may be a relatively small part of a pattern of adhesion slots that extends substantially entirely across the metal layer 14. The metal layer 14 may be a substantially continuous sheet except for the slots 24 formed therein.

The pattern in which the adhesion slots 24 are formed in the metal layer 14 may be any one of a number of different patterns. In the particular example embodiment shown in FIG. 2, the adhesion slots may be formed in a rectangular face-centered pattern with the rectangular cells which make up the pattern having an aspect ratio of about 1.73:1. For example, the cell dimensions of the rectangular cells making up the pattern may, in some embodiments, have dimensions of approximately 2000 microns by 3464 microns.

The pattern in which the adhesion slots are formed may, in some embodiments, be a rectangular pattern that has no face-centered node. As used herein and in the appended claims, a "rectangular pattern" refers to both a rectangular face centered pattern and to a rectangular pattern which is not face centered. In addition, as used herein and in the appended claims, a "rectangular pattern" includes a square pattern, and a "square pattern" refers to both a square face centered pattern and a square pattern that is not face centered. The pattern in which the adhesion slots are formed may, in some embodiments, be a square pattern such as a square face-centered pattern, which is the pattern conventionally used for adhesion holes.

The adhesion slots may be slots having a length dimension that is substantially greater than a width dimension of the slots. In some embodiments, the adhesion slots may have a length:width ratio of at least 5:1, or even equal to or greater than 10:1. Other length:width ratios, less than 5:1 or greater than 10:1, may be employed. In some embodiments, the adhesion slots may have a width dimension of substantially 50 microns and a length dimension of substantially 628 microns, resulting in a length:width ratio of about 12.5:1 and a slot area that is substantially the same as the area of 200 micron diameter circular adhesion holes that are conventionally employed. The 50 micron width of the slots, in these embodiments, may correspond to a minimum feature width according to design rules for a photolithography/etching technology employed to pattern the metal layer 14. Alternatively, wider widths, or narrower widths if design rules permit, may be employed for the adhesion slots.

Figure 3:
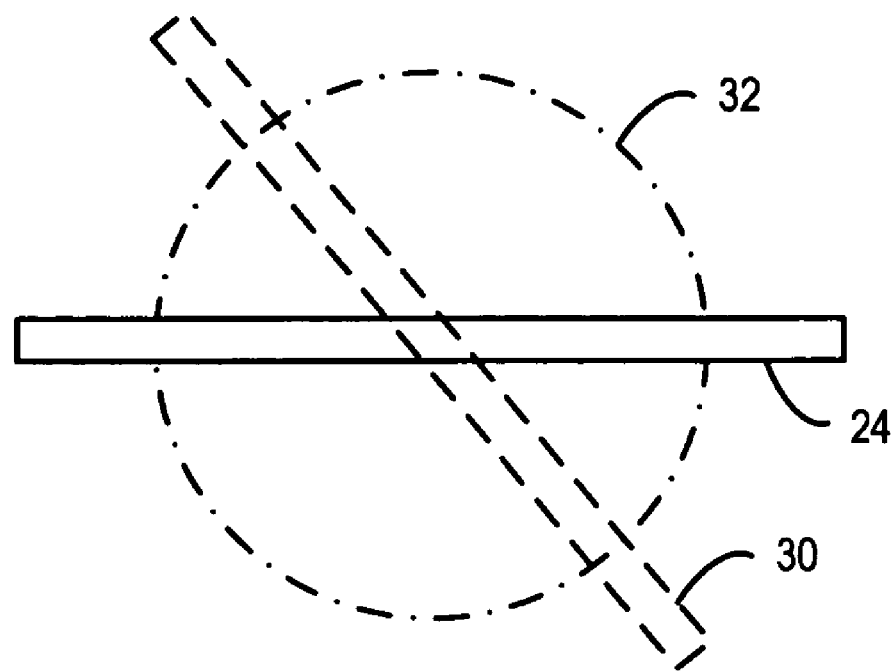
FIG. 3 is a view that schematically illustrates how an adhesion slot of the metal layer of FIG. 2 may be varied in location and/or orientation according to some embodiments.

Because the adhesion slots 24 have a substantially smaller width than conventional circular adhesion holes, even relatively dense signal trace layouts in the second metal layer 22 may be more readily arranged so as not to pass over or under one or more of the adhesion slots in the metal layer 14 or in another adjacent metal layer (not shown). Furthermore, according to some embodiments, changes in orientation and/or small adjustments in location of one or more of the adhesion slots 24 may be made to accommodate a signal trace layout that is substantially free of interference from the adhesion slots 24. FIG. 3 is a view that schematically illustrates how an adhesion slot 24 of the metal layer 14 may be varied in location and/or orientation according to some embodiments, to accommodate signal trace layout in an adjacent signal layer.

As indicated in phantom at 30 in FIG. 3, an adhesion slot may be oriented so as to be angled from a home orientation (indicated in solid lines). The degree of angling may be up to 90° in either a clockwise or counterclockwise direction from a home orientation, so that the adhesion slot may, in some embodiments, have any orientation whatsoever in the plane of the metal layer 14. The change of orientation of the adhesion slots may be applied to some adhesion slots but not to others, or different changes in orientation may be applied to different ones of the adhesion slots, so that in both cases at least some of the adhesion slots may be oriented at an angle relative to an orientation of at least some other adhesion slots in the same metal layer.

In addition or alternatively, in some embodiments, the center point of a slot may be displaced in any direction from the slot's nominal lattice point position in the slot pattern by a distance of up to about 250 microns. A dot-dash circle 32 in FIG. 3 schematically illustrates a region in which a center point of the slot 24 may be displaced from its nominal lattice point location. It should be understood that a slot pattern shall be considered to be rectangular notwithstanding any such minor displacements in slot center points. In some embodiments, the maximum distance from which the slot center point may be displaced from the nominal lattice point location may be more or less than 250 microns.

Figure 4:
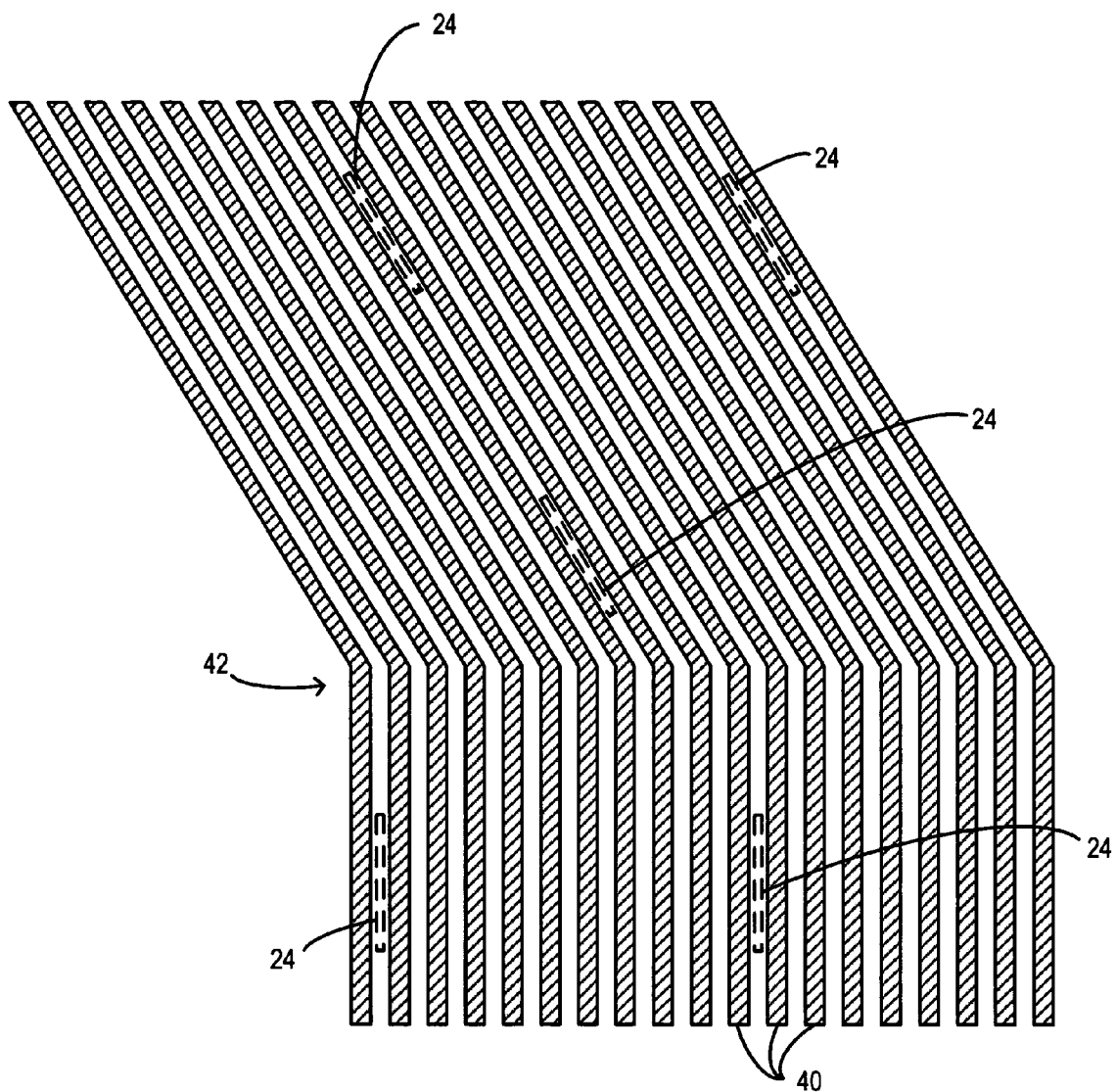
FIG. 4 is a plan view which illustrates a spatial relationship between traces in one of the metal layers of the package substrate of FIG. 1 and adhesion slots formed in another metal layer of the package substrate of FIG. 1.

FIG. 4 is a plan view which illustrates a spatial relationship between signal traces 40 in the metal layer (signal layer) 22 and adhesion slots 24 (shown in phantom) formed in the metal layer 14, according to one example embodiment.

It will be noted that the signal traces 40 shown in FIG. 4 are generally parallel to each other with a relatively small distance between each adjacent pair of signal traces. (Although the distance between adjacent signal traces is shown as slightly wider than the width of the adhesion slots 24, in practice the distance between adjacent signal traces may be substantially the same as the width of the adhesion slots.) As indicated at 42, angles are formed in the signal traces 40. The respective orientations of the adhesion slots 24 may be arranged, and if necessary the locations of the center points of the slots may be slightly displaced from nominal pattern lattice point locations, such that the slots effectively comb the signal traces 40, and none of the signal traces 40 passes over any of the slots 24. Consequently, signals may be routed over a reference plane without passing over holes, which may result in improved signal integrity (e.g., reduced near end crosstalk, far end crosstalk and/or timing skew) that might otherwise result were the traces routed over adhesion holes. High density signal trace layouts are accommodated by the adhesion slots disclosed herein. Furthermore, the avoidance of routing of signal traces over adhesion slots may provide for improved signal quality and may promote gate oxide durability in the associated IC (not shown in FIGS. 1–4), since the reduction of near end crosstalk may reduce the likelihood of signal spikes that might otherwise tend to degrade gate oxide in the associated IC.

With the adhesion slots as described above, dense signal trace arrangements may be provided on an adjacent signal layer without having any signal trace pass over or under any adhesion slot in an adjacent ground or power plane layer. With increases in signal trace density, the number of layers in the package substrate may be kept to a minimum or may be prevented from being increased. Consequently, there may be savings in the cost of the package substrate.

Figure 5:
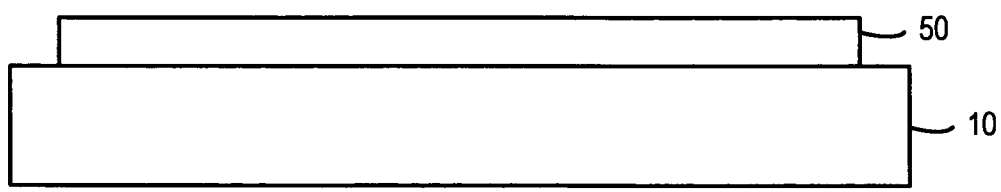
FIG. 5 is a schematic side view showing an IC mounted on the package substrate of FIG. 1.

FIG. 5 is a schematic side view showing an IC die 50 (e.g., a microprocessor or a chip set or a component of a chipset) mounted on the package substrate 10. In the schematic representation of FIG. 5, connecting structure between the IC die 50 and the package substrate 10 is not explicitly shown, but it should be understood that, for example, the IC die 50 may be mounted on, and electrically connected to the package substrate 10 in accordance with conventional principles.

Figure 6:
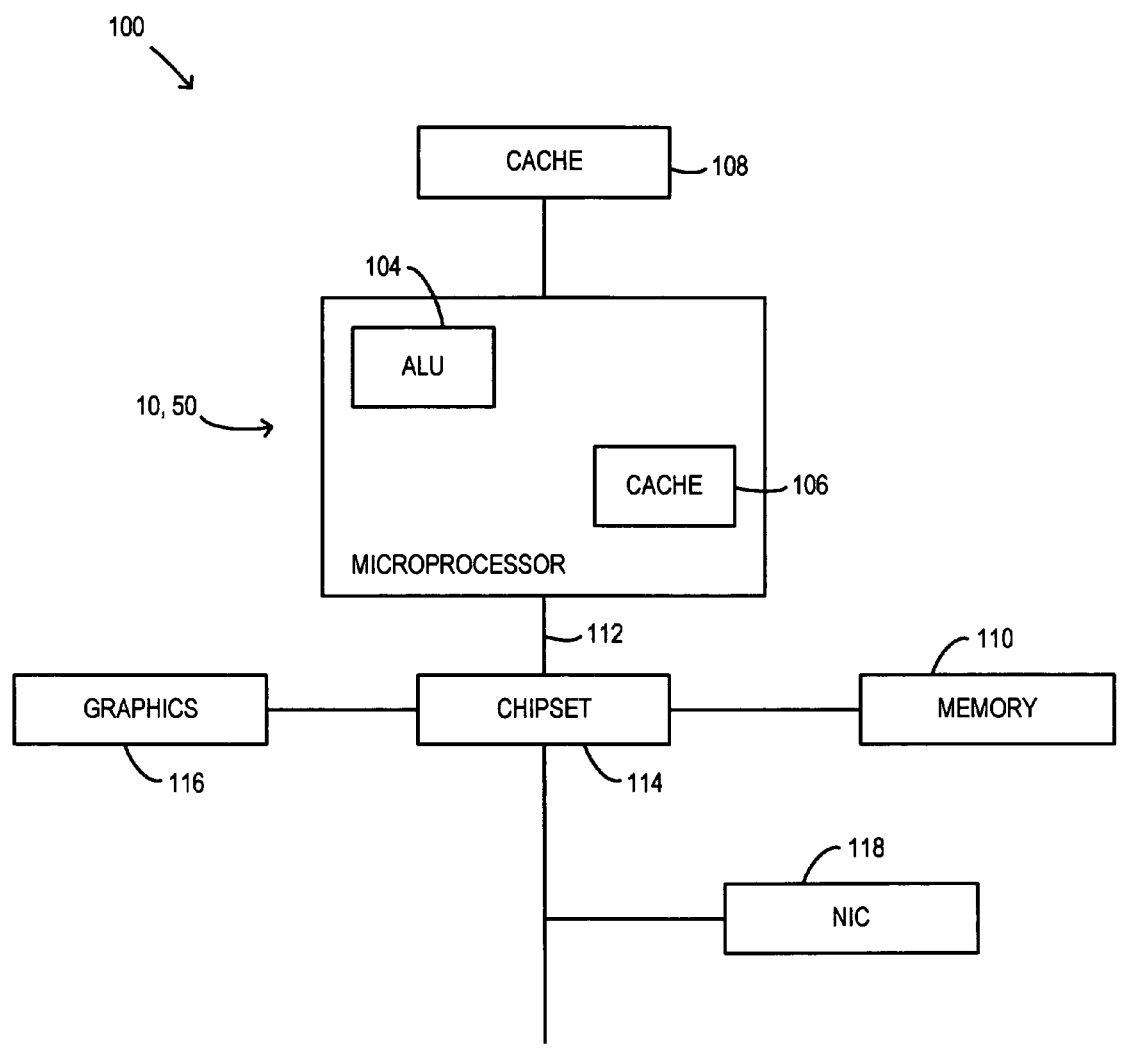
FIG. 6 is a block diagram of a computer system that includes the IC and package substrate of FIG. 5.

FIG. 6 is a block diagram of a computer system 100 that includes the IC die 50 and package substrate 10.

In some embodiments, the IC 50 may comprise a microprocessor, for example. The IC 50 comprises many sub-blocks, such as arithmetic logic unit (ALU) 104 and on-die cache 106. The IC 50 may also communicate to other levels of cache, such as off-die cache 108. Higher memory hierarchy levels, such as system memory 110, are accessed via host bus 112 and chipset 114. In addition, other off-die functional units, such as graphics accelerator 116 and network interface controller (NIC) 118, to name just a few, may communicate with IC 50 via appropriate busses or ports. The metal layer 14 (FIGS. 1 and 2, not shown separately in FIG. 6) may operate as a ground plane or a power plane for the package substrate 10.

Figure 7:
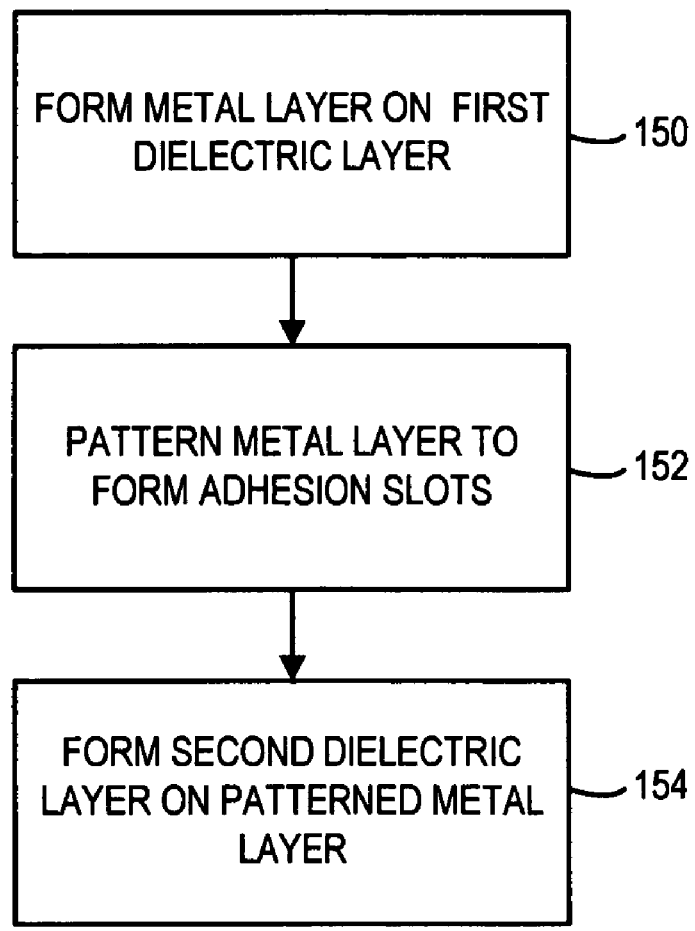
FIG. 7 is a flow chart that illustrates at least a portion of a process for forming the package substrate of FIG. 1.

FIG. 7 is a flow chart that illustrates at least a portion of a process for forming the package substrate 10.

As indicated at 150 in FIG. 7, metal layer 14 (FIG. 1) is formed on dielectric layer 12. This operation may be performed in accordance with conventional practices. Then, as indicated at 152 in FIG. 7, the metal layer 14 is patterned to produce adhesion slots such as the adhesion slots 24 referred to above. The patterning of the metal layer 14 may include photolithography and etching that are performed in accordance with conventional practices except for the nature of the pattern formed in the metal layer 14. The forming of the metal layer 14 may, for some purposes, be considered to include the patterning of the metal layer. The patterning of the metal layer 14 may be performed so as to form a pattern of adhesion slots in the metal layer 14, as described above in connection with FIGS. 2 and 3.

Next, at 154 in FIG. 7, the dielectric layer 18 may be formed on the metal layer 14, with the dielectric layer 18 adhering to the dielectric layer 12 by way of the adhesion slots 24 that were formed in the metal layer 14.

Those who are skilled in the art will recognize that the forming of the package substrate 10 may include operations that are performed before and after the operations described with reference to FIG. 7. For example, the metal layer 22 (FIG. 1) may be formed on the dielectric layer 18 and may be patterned to form a suitable arrangement of signal traces such as the traces shown in FIG. 4.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A method comprising:
forming a first metal layer on a first dielectric layer;
forming a second dielectric layer on the first metal layer;
forming a second metal layer on the second dielectric layer;
patterning the second metal layer such that signal traces are formed in the second metal layer;
patterning the first metal layer as a substantially continuous sheet having slots formed therein in a substantially rectangular pattern to allow the first and second dielectric layers to adhere to each other by way of the slots; and
adjusting an orientation of at least some of the slots in the substantially rectangular pattern such that none of the signal traces passes over any of the slots;
wherein the slots are arrayed substantially in a face-centered rectangular pattern.

2. The method of claim 1, wherein each of the slots has a length:width ratio of at least 5:1.

3. The method of claim 2, wherein the length:width ratio of each slot is at least 10:1.

4. The method of claim 1, wherein rectangular cells of the pattern have an aspect ratio of substantially 1.73:1.

5. The method of claim 1, wherein a first one of the slots has an orientation that is at an angle relative to an orientation of a second one of the slots.

6. The method of claim 1, wherein each of the slots has a width dimension of substantially 50 microns.

7. A method comprising:
forming a first metal layer on a first dielectric layer;
forming a second dielectric layer on the first metal layer;
forming a second metal layer on the second dielectric layer;
patterning the second metal layer such that signal traces are formed in the second metal layer;
patterning the first metal layer as a substantially continuous sheet having slots formed therein in a substantially rectangular pattern to allow the first and second dielectric layers to adhere to each other by way of the slots; and
adjusting an orientation of at least some of the slots in the substantially rectangular pattern such that none of the signal traces passes over any of the slots;
wherein each of the slots has a width dimension of substantially 50 microns.

8. A method comprising:
forming a first metal layer on a first dielectric layer;
forming a second dielectric layer on the first metal layer;
forming a second metal layer on the second dielectric layer;
patterning the second metal layer such that signal traces are formed in the second metal layer;
patterning the first metal layer as a substantially continuous sheet having slots formed therein in a substantially rectangular pattern to allow the first and second dielectric layers to adhere to each other by way of the slots; and
adjusting an orientation of at least some of the slots in the substantially rectangular pattern such that none of the signal traces passes over any of the slots;
wherein a first one of the slots has an orientation that is at an angle, other than a right angle, relative to an orientation of a second one of the slots.

* * * * *